United States Patent [19]

Grudkowski

[11] 4,233,573
[45] Nov. 11, 1980

[54] CARRIER CONCENTRATION CONTROLLED SURFACE ACOUSTIC WAVE VARIABLE DELAY DEVICES

[75] Inventor: Thomas W. Grudkowski, Glastonbury, Conn.

[73] Assignee: United Technologies Corporation, Hartford, Conn.

[21] Appl. No.: 11,612

[22] Filed: Feb. 12, 1979

[51] Int. Cl.³ .................. H01L 41/04; H03B 5/32; H03H 9/25; H03H 9/42
[52] U.S. Cl. .................. 331/107 A; 310/313 R; 310/366; 333/152; 333/195
[58] Field of Search .................. 331/107 A; 333/152, 333/195, 150; 310/313, 366

[56] References Cited

U.S. PATENT DOCUMENTS

| | | | |
|---|---|---|---|
| 3,710,465 | 1/1973 | Thomann | 333/152 X |
| 3,894,286 | 7/1975 | Armstrong | 331/107 A X |
| 4,005,376 | 1/1977 | Davis | 333/152 |
| 4,078,186 | 3/1978 | Folen et al. | 333/152 X |

Primary Examiner—Siegfried H. Grimm
Attorney, Agent, or Firm—M. P. Williams

[57] ABSTRACT

An electrically controlled surface acoustic wave (SAW) delay unit includes a piezoelectric and semiconductive substrate having a segmented rectifying contact disposed on the surface of an interaction region between launching and detecting transducers, with a controllable voltage applied to the rectifying contact, thereby to vary the concentration of carriers in the semiconductive material, so as to commensurately alter the velocity of surface acoustic waves in the module. The segmented contact provides significant increase in the achievable variation in velocity, and therefore in phase as well. An oscillator configuration includes such a module with an amplifier and other circuit elements formed integrally therewith in a monolithic fashion. Exemplary embodiments include depleting the carrier concentration of semiconductive material, both piezoelectric material and nonpiezoelectric material having a piezoelectric surface layer thereon, as well as enhancement of carrier concentration of semiconductive material at the interface with a piezoelectric surface layer thereon. Various adjunctive design and fabrication techniques are also disclosed.

6 Claims, 9 Drawing Figures

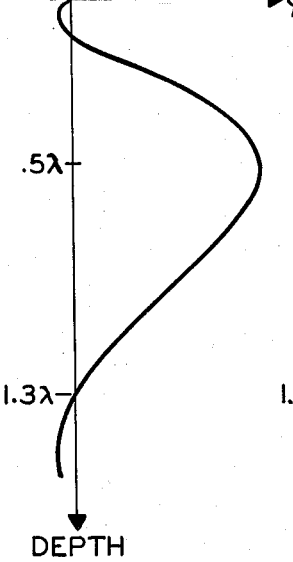
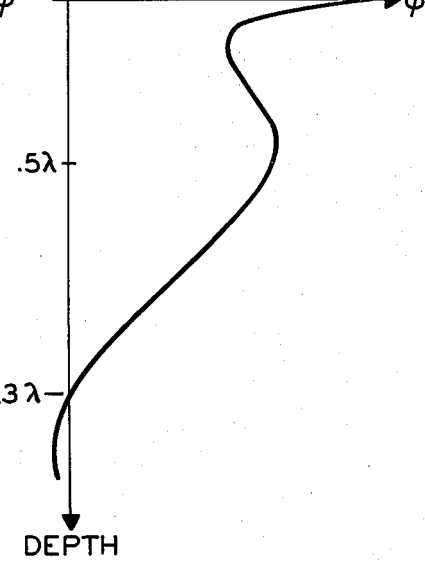
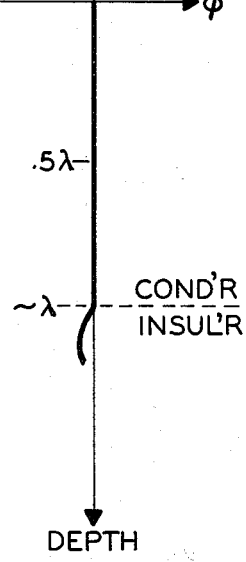
FIG.1 PRIOR ART
SHORTED GaAs SURFACE
FIG.2 PRIOR ART
UNSHORTED GaAs SURFACE
FIG.3
UNDEPLEATED DOPED SEMICOND.
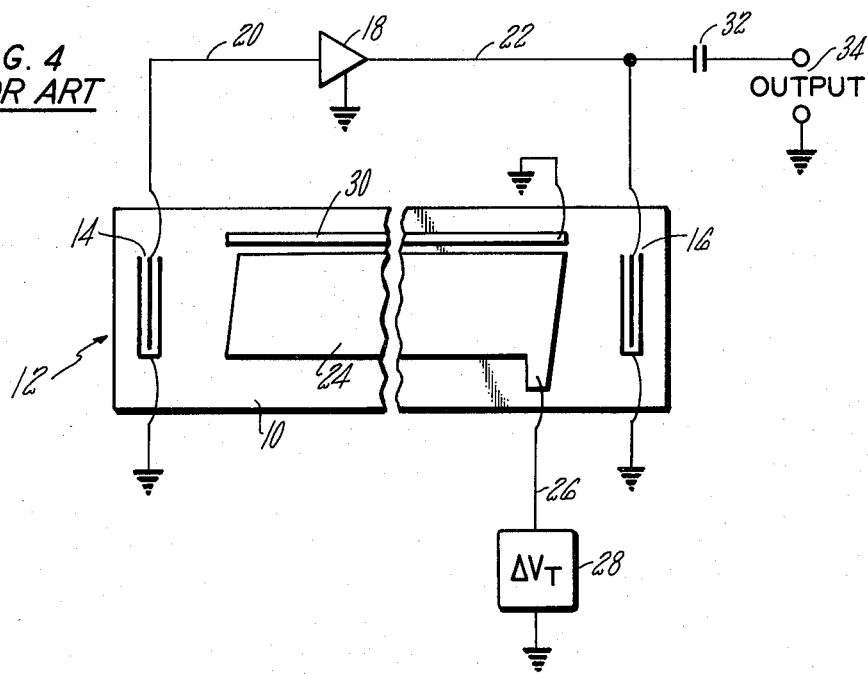
FIG. 4 PRIOR ART

CARRIER CONCENTRATION CONTROLLED SURFACE ACOUSTIC WAVE VARIABLE DELAY DEVICES

BACKGROUND OF THE INVENTION

1. Field of Art

This invention relates to electrically tunable surface acoustic wave variable delay lines, and more particularly to control of surface acoustic wave velocity by variation of the carrier concentration in the bulk of a piezoelectric and semiconductive SAW module.

2. Description of the Prior Art

As is known, the frequency of a surface acoustic wave (SAW) propagating in a piezoelectric medium is a faithful reproduction of the electrical wave applied to an electroacoustic transducer on the surface of the SAW module. The velocity of the wave propagating in the module is, on the other hand, dependent upon the material itself. And the wavelength or periodicity of such a wave is a combined function of the frequency and the inherent wave velocity of the material. Surface acoustic wave delay lines are used as frequency determining elements in circuits, such as ocillator loops including a SAW device and an amplifier. In some cases, the SAW device is utilized because it has a property that alters the velocity of the SAW wave as a consequence of mechanical stress of the SAW module, such as in force and pressure transducers. In other cases, the variation in SAW velocity as a function of temperature is utilized.

In the more general case, SAW devices are used as principal frequency control elements for oscillators, due to the capability of controlling the SAW module so that its parameters remain essentially constant within a desired tolerance, thereby controlling the frequency of an oscillator loop in which it is included to a desired degree of accuracy. Important advantages in utilizing SAW devices in comparison, for instance, with conventional bulk acoustic resonators, are that the fundamental frequencies may be higher by an order of magnitude in the SAW devices, and the planar fabrication techniques for SAW devices promote low cost batch production.

The simplest SAW frequency control element is simply a delay line. Another typical SAW frequency control element is a resonator having reflector contacts or surface discontinuities extending from either side of the launch and detector transducers which are separated by an interaction region. If the inherent wave propagation velocity of the material is kept constant, the least lossy SAW propagation will occur at a frequency which has, at that constant SAW velocity, a wavelength which is in phase for all successive waves reflected from the reflection elements of the resonator, thereby defining a preferred frequency for control of an oscillator loop formed by connection in series with an amplifier. The most common form of frequency control used with SAW delay lines and resonators of the prior art is an external, variable phase shifting circuit in series with the SAW element. This allows fine-tuning of a closed-loop oscillator frequency, to a limited extent. As is known in the art, the velocity of a surface acoustic wave in a highly piezoelectric medium, such as lithium niobate, is slower when the surface of the medium is electrically short circuited (such as by a metallic conductor) then it is when the surface is unshorted. The difference in the two velocities ($\Delta V$) divided by the unshorted velocity ($V$) provides an indication ($\Delta V/V$) of the variation in frequency of an oscillator loop ($\Delta f/f$) incorporating such a medium. This phenomenon is used to advantage to control the resonant frequency of a reflective resonator, of the type referred to briefly hereinbefore, in a device described in Cross, P. S. et al, Electronically Variable Surface-Acoustic-Wave Velocity and Tunable SAW Resonators, Applied Physics Letters, Vol. 28, No. 1, Jan. 1976, pp. 1–3. Because of the fact that the $\Delta V/V$ obtainable with highly piezoelectric material such as lithium niobate is quite high, only a small portion of the SAW propagation path need be subjected to selective short circuiting in order to provide a usefully high $\Delta f/f$, which is on the order of 1.4%. However, in order to provide such a module in an oscillator configuration integrally formed therewith in a monolithic fashion, semiconductive properties are required. Active circuits are inherently incapable of being formed monolithically into integrated circuit structures, such as SAW controlled oscillators, utilizing material which is only piezoelectric, such as lithium niobate. On the other hand, the $\Delta V/V$ obtainable with surface shorting of piezoelectric semiconductive materials (which can support active and passive device fabrication for integrated circuits) is small, being several orders of magnitude below that for lithium niobate.

A variable delay line employing a piezoelectric and semiconductor substrate in which carrier concentration is controlled from the surface so as to alter the velocity of surface acoustic waves within the substrate is described in Chao, G., Monolithic Surface-Acoustic-Wave Phase Shifter, Electronics Letters, Feb. 8, 1973. Therein, a Schottky-barrier distributed varactor diode is fabricated on a cadmium sulphide substrate. The diode consists of a thin film of gold distributed across the entire interaction region between input and output transducers. However, this device provides less $\Delta V/V$ than might be expected since it inherently has a surface shorting characteristic caused by the diode metallization.

SUMMARY OF THE INVENTION

Objects of the invention include improvements in electrically tunable SAW variable delay lines and in monolithic SAW oscillators.

According to the present invention, an electrically controlled surface acoustic wave variable delay line includes a piezoelectric and semiconductive substrate having a segmented rectifying contact disposed in an interaction region between coupling transducers, and a variable voltage applied to the segmented contact to control carrier concentration within the bulk of the substrate, thereby to control the velocity of the SAW wave therein. According further to the present invention, a segmented-contact, monolithic oscillator is formed on a semiconductive and a piezoelectric substrate, an amplifier and a voltage controlled SAW variable delay line being integrally formed in the substrate.

The invention employs control of bulk potential distributions with a minimal surface shorting effect which, for a given material, provides inherently greater velocity variation and therefore tunable frequency control than in a depletion-controlled device with a metal contact across the entire propagation region.

The present invention may employ depletion of the carrier concentration in semiconducting semiconductive material, or, in certain configurations, enhancement of carrier concentration in semi-insulating semiconductive material. The invention may employ a single material which is both semiconductive and piezoelectric, such as gallium arsenide, or it may consist of a composite structure including semiconductive material which is not piezoelectric (such as silicon) and piezoelectric material which is not semiconductive (such as zinc oxide); or, the practice of the invention may employ material which is both piezoelectric and semiconductive and is enhanced with a piezoelectric layer that is not semiconductive.

The invention may be practiced in the form of a surface acoustic wave variable delay line, consisting of a semiconductive and piezoelectric substrate having a segmented rectifying contact thereon which is connected to a source of variable tuning voltage, or the invention may be practiced in an integrated circuit, such as a monolithic voltage controlled SAW oscillator, including active devices along with such a delay line.

The invention may be practiced in conjunction with a wide variety of known integrated circuit and SAW features and fabrication techniques. For instance, when a semiconductive and piezoelectric material is employed, the launching and detecting transducers may comprise biased interdigital Schottky barriers, or interdigital transducers on a zinc oxide layer over a gold shorting plane, as is known in the art. Or, selective doping of the interaction region of the SAW device and the fabrication regions for active circuit devices may be made while leaving the region of launching and detecting transducers undoped. Or, if desired, launching and detecting transducers may be fabricated on portions of a semi-insulating substrate which have had the doped semiconductive material removed in a tapered fashion, as by etching through a shadow mask. When practiced in an integrated oscillator configuration, the present invention may be utilized with series tuned launching and/or detecting transducers in order to match the impedance of an amplifier integrally formed therewith. The invention may be utilized in a variety of applications in which the time delay, phase or frequency of RF signals is to be controlled. The invention is readily implemented in integrated, monolithic or layered structures capable of fabrication utilizing techniques which are well known in the art. The invention provides an electrically tunable SAW delay line capable of being formed with active and passive circuits in a truly integrated fashion, having minimum spurious effects, relatively high efficiency and flexibility of design, fabrication and integration with other circuit elements and devices.

The foregoing and other objects, features and advantages of the present invention will become more apparent in the light of the following detailed description of exemplary embodiments and variations thereof, as illustrated in the accompanying drawing.

BRIEF DESCRIPTION OF THE DRAWING

FIG. 1 is a simplified diagram illustrative of potential induced by a surface acoustic wave in gallium arsenide beneath a shorted surface;

FIG. 2 is a simplified diagram illustrative of potential induced by a surface acoustic wave in gallium arsenide beneath an unshorted surface;

FIG. 3 is a simplified diagram illustrative of potential induced by a surface acoustic wave in an undepleted, doped semiconductive medium;

FIG. 4 is a schematic plan view prior art depletion-controlled device employing contact;

DETAILED DESCRIPTION

Figure 5:
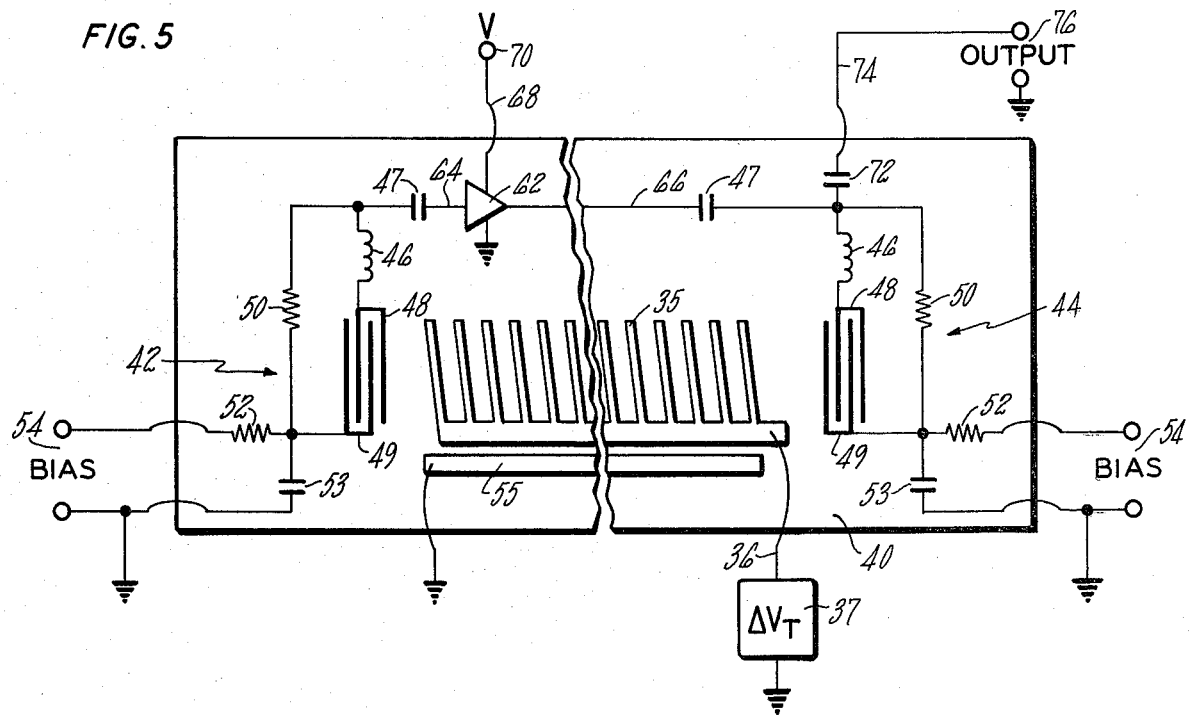
FIG. 5 is a simplified schematic plan view of one embodiment of the invention employing a segmented rectifying contact, including series tuned and biased Schottky barrier coupling transducers, and an amplifier integrally formed with the SAW module into an oscillator loop in a monolithic fashion.

The operation of a variable SAW delay line or phase shifter in accordance with the invention is based upon the ability to control the SAW velocity by electronically controlling the carrier distribution or electric field shorting within the substrate along the propagation path. The concept is analogous to the change in SAW velocity produced when a shorting electrode is placed on the surface of any piezoelectric crystal. This change in velocity, $\Delta V$, with respect to the velocity of the electrically free crystal, V, is the familiar $\Delta V/V$ which determines interdigital transducers design. The electrode, in this case, shorts out the electric field of the surface wave at the surface. Within the crystal, an electric field distribution still exists, although it is altered by the presence of the shorting plane. This shorting out of the electric field of the wave may be thought of as reducing the stored energy of the wave, resulting in a lower velocity.

The effect of short circuiting the surface of a gallium arsenide saw module is reported in Grudkowki, T. W., Microwave Laboratory Report No. 2440, Stanford University, May, 1975, pp. 83–87. Referring now to FIGS. 1 and 2, it is seen that the variation in potential ($\phi$) as a function of depth beneath the surface of gallium arsenide when the surface is shorted (FIG. 1) and unshorted (FIG. 2) is not very great; in fact, from approximately 6/10 of one wavelength beneath the surface, the potential is essentially the same when shorted as when unshorted. Thus, the maximum $\Delta V/V$ obtainable by selectively shorting the surface of gallium arsenide produces small carrier frequency variations in an oscillator configuration, which may be on the order of 400 parts per million. This is in contrast with about 14,000 parts per million which was reported by Cross et al, supra, for surface shorting effects in lithium niobate.

The concept of carrier concentration control over SAW velocity may be thought of as extending a massless electrode into the bulk of the substrate, at least to a depth of interest, which may be on the order of one wavelength of the design center frequency of the device. This is achieved by means of semiconductive material, in which carries within the bulk short out the electric fields of the piezoelectric SAW, directly within the bulk, as illustrated in FIG. 3.

The ability of a semiconductor to support potential, $\phi_{sc}$, at any frequency, $\omega$, is expressible in terms of the reduction therein from the potential supported by a pure insulator, $\phi_i$, as a function of the conduction frequency, $\omega_c = 2\pi f_c$:

$$\phi_{sc} = \phi_i \frac{1}{1 - j\omega_c/\omega}$$

For $\omega_c \gg \omega$, the material acts like a conductor (metallic). Thus, an essentially perfect short is produced when the conduction frequency, $f_c$, of the material is much greater than the surface wave frequency, f. The conduction frequency for n-type GaAs is given by:

$$f_c = \frac{\sigma}{\epsilon} = \frac{nq\mu}{\epsilon},$$

where $\sigma$ is the material conductivity, $\epsilon$ is the dielectric constant, n is the electron free carrier concentration, q is the electronic charge, and $\mu (\approx 5000 \text{ cm}^2/\text{Volt-sec})$ is the electron mobility. The condition, $f_c/f \gg 1$, implies that the GaAs semiconducting layer carrier concentration must satisfy the condition, $$n \text{ (cm}^{-3}) \gg 10^{10} f(\text{MHz})$$

Since carrier concentrations near $10^{15}$ cm$^{-3}$ may be utilized, this condition is well satisfied over the 100 MHz to 1 GHz frequency range of interest. Analogous behavior obtains for p-type semiconductors and for other materials.

The extent of bulk electric field shorting in semiconducting material is electronically controlled by reverse biasing a rectifying contact or electrode pattern located on the substrate surface. With increasing reverse bias, the depletion depth is increased beneath and at the edges of the electrode pattern until the entire layer is depleted of conducting electrons. Semi-insulating layers may have conductivity enhanced by voltage-controlled carrier injection.

FIG. 4 illustrates a solid-contact module of the prior art, of the general type described by Chao, supra, wherein a module 12 comprises a piezoelectric and semiconductive substrate 10 in which carrier concentration is controllable by voltages applied to a solid rectifying contact extending over substantially the entire surface. In FIG. 4, a pair of coupling transducers 14, 16 are used for launching and detecting a surface acoustic wave within the substrate 10. As depicted in FIG. 4, the transducer 14 is a detector that provides acoustoelectric coupling between the surface acoustic wave in the substrate 10 and external circuitry, such as an amplifier 18 which is connected thereto by a suitable connection 20. The output of the amplifier is applied over a suitable connection 22 to the transducer 16 which operates as a launching transducer to provide electroacoustic coupling between the amplifier 18 and the acoustic wave within the substrate 10. Disposed on the surface of the substrate 10 is a rectifying contact 24 which is coupled by a connection 26 to a source of variable tuning voltage ($\Delta V_T$) 28. The voltage applied to the rectifying contact 24 is referenced against a ground contact 30, which forms a non-rectifying or ohmic contact with the substrate 10. The output of the oscillator loop may be taken through a coupling capacitor 32 to output terminals 34. The rectifying contact 24 is shown with ends tilted with respect to the direction of propagation of the wave, which serves to reduce reflections at the ends of the contact 24, as is known in the art.

Calculation for a hypothetical ideal GaAs substrate having an n-type epitaxial layer extending one wavelength beneath the surface show that the maximum $\Delta V/V$ which should be obtainable by bulk shorting, without an electrode on the surface, is about 900 parts per million. Similarly, with a solid electrode over the entire surface of the interaction region, $\Delta V/V$ of about 600 parts per million should be attained. With a segmented electrode, providing minimum surface shorting according to the invention, the $\Delta V/V$ obtained will approach the higher figure.

The effect of bulk shorting is illustrated in FIG. 3. Comparison of both FIG. 1 and FIG. 2 separately with FIG. 3 illustrates the advantage which is obtained by employing a segmented electrode to control bulk shorting of potential in the surface acoustic wave medium, in accordance with the present invention. When a semiconducting medium, such as doped gallium arsenide (an n-type epitaxial layer on a semi-insulating gallium arsenide substrate) is examined, it is found to be very reasonable to short the potential to a depth on the order of a wavelength, which is sufficient to achieve a meaningful $\Delta V/V$. When the carrier concentration therein is depleted by applying a suitable voltage to a rectifying contact on the surface thereof, rendering the epitaxial layer semi-insulating, the potential/depth distribution depicted in FIG. 1 occurs below the rectifying contact. It is obvious that there is a significant improvement in the change in charge distributions illustrated by comparing FIG. 3 to FIG. 1 and that illustrated by comparing FIG. 3 to FIG. 2. This is the principal aspect of the present invention.

Since the tuning range of an oscillator controlled by a SAW variable delay line is known to be $$\Delta f/f_o = \Delta V/V,$$

by adjusting the bulk conductivity the available frequency control range obtainable is substantially increased when the surface is as nearly unshorted as possible. Thus, $\Delta V/V$ occasioned by control of carrier concentration in semiconductive material, within the bulk of the substrate rather than at the surface, allows utilization of electronic device supportive piezoelectric substrates having a useful frequency variable as a function of voltage applied to surface contacts. The significant fact is that by means of minimal surface shorting, control of carrier concentration, between conductive material and sufficiently insulative material to support potential, can achieve a significant variation in the velocity of the wave in the substrate.

The substrates which may practice the present invention need only have two properties: there must be a significant piezoelectric property adjacent the surface, and there must be a capability of altering charge carrier concentration by a significant amount to convert between semiconducting and semi-insulating properties, in the bulk along and/or immediately beneath the surface. As used herein in the comparative or contrasting sense, "semiconducting" refers to carrier concentration, n, high enough so that $f_c/f \gg 1$, as described hereinbefore, and "semi-insulating" refers to carrier concentrations low enough so that $\phi_{sc} \approx \phi_i$, as defined hereinbefore. Of course, tuning voltages between those for semiconducting or semi-insulating concentrations will produce effects which are in-between. And "semiconductor" or "semiconductive" refers to the property of material such as GaAs or Si, which allows it to be either semiconducting or semi-insulating, depending on carrier concentrations, as a consequence of doping and/or charge-induced depletion or enhancement. And the doping to produce n-type or p-type semiconducting material may be provided by epitaxial growth on a substrate, chemical diffusion into a substrate surface, or ion bombardment, all as is well known in the art.

The embodiment of the invention shown in FIG. 5 illustrates one form of the segmented rectifying contact 35 of the invention, having a plurality of essentially transverse fingers extending from a common longitudinal conductor that is connected by a suitable lead 36 to a source 37 of variable tuning voltage. The segmented contact may be fabricated in a meandering configuration, if desired, instead of the "E" configuration shown in FIG. 5. The segments of the rectifying contact 35 may be tilted as shown so as to reduce reflections, if desired, though this forms no part of the invention. The segmented rectifying contact 35 of the invention is preferred over the prior art non-segmented rectifying contact 24 illustrated in FIG. 4 because the surface between segments can vary between semiconducting and semi-insulating, for maximum potential variation, and thus maximum $\Delta V/V$ over the entire interaction region; the potential variation beneath the solid contact of the prior art (FIG. 4) will always be less than such maximum. The segmented rectifying contact 35 may be made with the segments as short (along the propagation direction) as is practically feasible consistent with assurance of continuity and effective fabrication techniques. The spacing between the segments of the rectifying contact 35 may be on the order of a wavelength or so, to ensure continuity of enhancement or depletion in the successive regions associated with each segment, and may be other than an odd number of half wavelengths apart so as to avoid presenting apparent short circuits which could tend to reduce the difference between the potential in the substrate with the substrate nonconducting and the potential in the substrate with the substrate conducting. In other words, if when the substrate is nonconducting, it has the potential distribution illustrated in FIG. 1, rather than the potential distribution illustrated in FIG. 2, there will be less change in the velocity when switching from the unshorted bulk to the shorted bulk, the desired maximum effect being illustrated by comparison of FIGS. 2 and 3, as described hereinbefore, which is substantially achieved by the present invention. To achieve an unshorted potential distribution as near to that of FIG. 2 as possible, the segmented contact should have a minimum metallized area. Because there is no current flow through the contacts 35, 55, the field established in the substrate by the voltage between them may be quite uniform, to the depth of interest.

Figure 6:
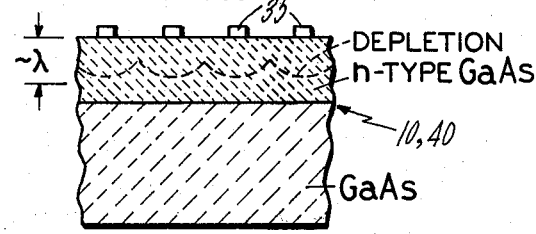
FIG. 6 is a simplified sectional diagram illustrating carrier concentration depletion in n-type gallium arsenide.

The effects exploited by the invention are illustrated for several exemplary embodiments in FIGS. 6–9. In FIG. 6, depletion of doped, n-type GaAs is illustrated. The depth of the doped, semiconducting layer is not critical, but it may be on the order of a wavelength at the design center frequency of the SAW variable delay line, in accordance with the invention. As illustrated in FIG. 6, a small amount of voltage applied to the segmented rectifying contact 35 will cause depletion of the n-type carriers in the bulk material, along the surface between the contact segments and below the surface. This depletion reduces the fraction of the bulk which is shorted, the portion of doped (n-type) material beneath the depletion line and above the intersection with the semi-insulating gallium arsenide still remains short circuited with highly concentrated carriers. Thus a partial increase in the velocity of waves on the surface would be effected by the partial depletion illustrated in FIG. 6. With the application of yet a higher voltage to the segmented rectifying contact 35, the depletion layer may be driven down to the semi-insulating barrier (or more than one wavelength below the surface), which would then cause the entire depth of interest in the bulk to be unshorted, thereby having charge distribution essentially as shown in FIG. 2 between the contacts and as shown in FIG. 1 only in the limited regions beneath the contacts. This results in maximum wave velocity for the device, which approaches that of an insulating substrate with no surface shorting. Obviously, variations in the voltage will cause variations in the wave velocity, and hence in the frequency of a loop which includes the SAW device in accordance with the invention.

Figure 9:
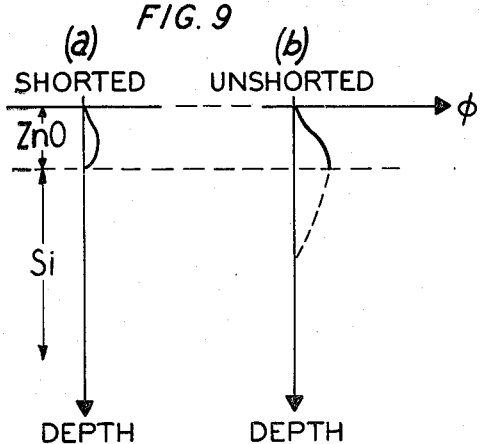
FIG. 9 is a pair of simplified diagrams illustrating potential induced in a zinc oxide-on-silicon substrate with the carrier concentration at the ZnO/Si interface enhanced and unenhanced.

This invention has been primarily presented hereinbefore as embodied with an epitaxial GaAs substrate, which is both piezoelectric and semiconductive. However, the invention may be practiced utilizing a composite SAW module having a piezoelectric layer (such as ZnO) on a non-piezoelectric substrate (such as Si). Because Si is non-piezoelectric, any SAW propagating therein does not have an electric field associated with the strain wave. But the ZnO is highly piezoelectric, so that even a thin layer (1/20 or 1/2 of a wavelength thick) will exhibit a strong electroacoustic interaction. However, the ZnO is essentially an insulator, and is not capable of being bulk-shorted by carriers, as is a semiconductor. As shown in illustration (b) of FIG. 9, a ZnO layer on a semiconductive substrate of Si will produce a potential as a consequence of the electric field associated with a piezoelectric SAW therein. The potential is zero at the surface, and builds to a maximum deep within the thin ZnO layer; and with semi-insulating Si adjacent thereto, the potential may decay gradually in the Si bulk. However, illustration (a) of FIG. 9 shows that, if the ZnO/Si interface is shorted, the potential at the interface must necessarily be zero. Thus, it is zero at both ZnO surfaces, and exists only within the ZnO. The Si is incapable of generating its own potential because it is non-piezoelectric; and it is now isolated from the potential in the ZnO by the short circuit at the interface. Although the potential in the ZnO is not totally nulled when the ZnO/Si interface is shorted, the variation in potential in the ZnO is substantially greater than that in GaAs, and the tuning effect in the composite embodiment is also greater than in the monolithic GaAs embodiment. For instance, with a 1/20 wavelength deep ZnO layer, $\Delta V/V$ is on the order of 3,000 parts per million; and a depth of a half wavelength may yield 9,000 parts per million. But, the simplicity and ease of fabrication of the epitaxial GaAs embodiment (FIGS. 5 and 6) may be preferred, particularly where small $\Delta f/f$ tuning ranges are acceptable, as in frequency stabilizers and modulators.

Figure 7:
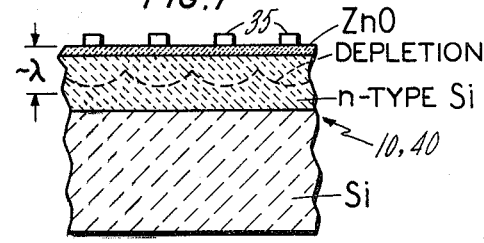
FIG. 7 is a simplified sectional diagram illustrating depletion of carrier concentration in a doped semiconductor with a zinc oxide layer.
Figure 8:
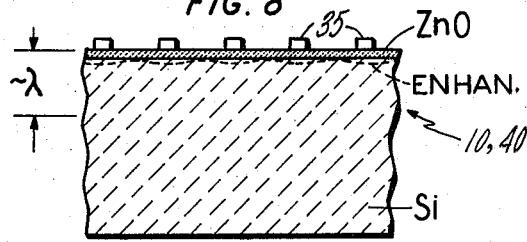
FIG. 8 is a simplified sectional diagram illustrating enhancement of carrier concentration at the interface of semiconductor (such as silicon) with a zinc oxide layer.

The shorting of the ZnO/Si interface may be achieved by use of a semiconducting material which is undepleted, as illustrated in FIG. 7, or by use of a semi-insulating material which is electrically enhanced by carrier injection induced by an oppositely polarized tuning voltage on the rectifying contact 35 (such as plus volts for n-type carriers); or by establishing an inversion layer at the semiconductor material interface. Since a semiconductor can, in general, only be enhanced by carrier injection to a depth of a small fraction of a micron, use of enhancement tuning will be limited to cases similar to the interface shorting of FIG. 8.

The ZnO layer may be used on a GaAs substrate to improve the frequency tuning range. In such case, the M-I-S diode formed by a segmented metal contact 35 on the ZnO surface may comprise the rectifying contact. The operation described with respect to FIG. 7 is applicable: since the GaAs substrate will provide potential, it must be semiconducting to provide bulk shorting when undepleted by the tuning voltage. The net result is a module more difficult to fabricate than an uncoated epitaxial GaAs module, but one having a much larger $\Delta V/V$ and commensurate tuning range.

In FIG. 5, the substrate 40 may support a large number of circuit elements as well as the basic SAW device. Specifically, the launching and detecting transducers 42, 44 may comprise well-known series tuned transducers, each of which includes an inductor 46 and a capacitor 47 in series with one side 48 of the transducer. The transducers 42, 44 may also comprise biased Schottky barrier transducers, known in the art to permit efficient acoustoelectric transduction on a semiconducting surface. The bias is applied to both sides 48, 49 of each transducer across an isolation resister 50 to avoid RF shorting of the transducer. The bias is applied through a large, current-limiting resistor 52 leading to the source of bias voltage, such as a bias port 54, the other side of which is connected to a nearby ohmic ground contact, such as a contact 55. The side 49 is provided RF (but not DC) ground through an isolation capacitor 53. The fingers 48, 49 are formed with suitable metallization, such as deposited aluminum, to provide Schottky barrier contact with the substrate 40, which with the bias to a nearby ohmic contact, such as the contact 55, drives the carriers out of the substrate adjacent the transducers 42, 44 for relatively high coupling efficiency, as is known. This avoids bulk short circuiting of the transducers which would lower their efficiency if formed in a normal interdigital transducer configuration on semiconducting material. The inductor 46 is used to resonate the transducer capacitance so that, at the transducer center frequency, the acoustic radiation resistance, with proper design, matches the circuit impedance (typically 50$\Omega$) of the related amplifier. However, efficient transducer operation can also exist with no inductive tuning if the untuned transducer capacitive impedance matches that of the circuit connected therewith, such as the input of an FET amplifier. In integrated circuits, the capacitances can be controlled and kept relatively small, thereby reducing the need for inductance. Thus, the configuration of coupling transducers illustrated with respect to FIG. 5 is simply to permit the formation of the transducers directly on a doped semiconducting surface, such as an n-type epitaxial layer of gallium arsenide, and to match amplifier input impedance, if necessary. It should be understood that the nature and design parameters of the series tuned, biased Schottky barrier transducers are known in the art and form no part of the present invention, except as an illustration of the environment of the invention in a semiconductive and piezoelectric substrate where the transducers and an associated amplifier are formed directly on the doped semiconducting material of the substrate.

In FIG. 5, an amplifier 62 is shown as being formed in the substrate 40 and connected by suitable metalliation 64 to the series capacitor 47 of the detecting transducer 42, and connected by suitable metallization 66 to the series capacitor 47 of the launching transducer 44. The amplifier 62 may be connected by a suitable lead 68 to a source of operating voltage 70. The oscillator output may be taken through a coupling capacitor 72 through a suitable lead 74 to output terminals 76.

In FIG. 5, the amplifier 62 and the components for forming the series tuned transducers 42, 44 as well as the coupling capacitor 72 are all shown as being fabricated on the substrate 40 along with the surface acoustic wave interaction region itself. Similarly, elements of the tuning voltage source may be formed within the semiconducting portion of the substrate 40, in the case where the substrate 40 has a semiconducting region, such as an n-type gallium arsenide epitaxial layer, adjacent to the surface. On the other hand, the circuit elements may not be directly formed in the substrate, and the variable delay line of the invention may be generally configured as shown in FIG. 4 except that the rectifying contacts are segmented, either as shown in FIG. 5 or meandering, with simple interdigital transducers 14, 16 and external amplifier circuitry 18.

As an example, a four micron thick, $n=10^{15}cm^{-3}$, GaAs epitaxial layer requires a tuning voltage ($\Delta V_T$) of about $-12$ volts for complete depletion, and conversion to semi-insulating condition. For operation at several hundred megahertz, semiconducting layers of about 10 or 20 microns, and/or ZnO layers of about 1 or 2 microns may be used with tuning voltages on the order of 10 to 20 volts maximum.

In FIG. 5, the transducers 42, 44 are described as Schottky barrier transducers in order to permit fabrication thereof directly on a semiconducting surface (such as n-type epitaxial gallium arsenide). However, the utilization of such barriers is not required if other accommodations are made for the semiconductor surface. For instance, the semiconducting epitaxial layer could be tapered by sputter etching with a shadow mask so that the surface beneath the fingers 48, 49 would be that of the semi-insulating gallium arsenide substrate, rather than that of the semiconducting epitaxial layer. Or, in certain instances where broadband response is not undesirable, the insertion loss reduction techniques described in Quate and Grudkowski U.S. Pat. No. 3,935,564 may be utilized. Obviously, in the instance where semi-insulating silicon is utilized throughout (FIG. 8), employing injected carrier concentration enhancement to induce shorting of the charge, the transducers may be formed directly on the surface. In such cases, active device fabrication on the semi-insulating substrate may be provided for in certain regions of the substrate by creating localized charged enhanced regions by means of ion bombardment, diffusion, or epitaxial layer growth. Similarly, in the case of zinc oxide on silicon, or other composite material substrates, fabrication of the launching and detecting transducers 44, 42 may pose no problem.

The segmented rectifying contact 35 may be formed in a variety of ways. On n-type epitaxial gallium arsenide, the contact 35 may comprise a Schottky barrier formed by depositing aluminum or other suitable metal directly on the surface. Or, the segmented rectifying contact 35 may be a p-n junction formed by ion bombardment or diffusion techniques, all as is known in the art. On zinc oxide, the inherent insulating properties of the ZnO provides performance as a Metal-Insulator-Semiconductor (M-I-S) rectifying structure. The presence of an additional thin oxide, such as native oxides of Si or GaAs, at the ZnO/semiconductor interface may be desirable to reduce perturbations in the intended operation of the device as may be caused by semiconductive surface states. The invention may be used in a variety of configurations, including those illustrated herein and as a tuning element disposed between the gratings of a grating resonator of the type disclosed in Cross et al, supra. The degree of improvement depends on the degree to which metallization is reduced below that of a solid contact; however, the invention is not limited to any particular degree of segmentation and commensurate improvement since this may vary widely in dependence on the overall design parameters of any utilization of the invention.

Thus is is apparent that the invention is not found in a particular implementation, but in the utilization of a segmented rectifying contact 35 for control over carrier concentration, to adjust the ability of a semiconductor beneath the surface of a substrate to support a potential which is necessary for the electric fields attendant a piezoelectric surface acoustic wave, thereby to provide increased control over the electrical properties of the substrate and therefore the velocity of a piezoelectric wave traveling in the substrate. This may be done by depletion or enhancement, in monolithic structures of single material to composite materials. Similarly, although the invention has been shown and described with respect to illustrative embodiments thereof, it should be understood by those skilled in the art that the foregoing and various other changes, additions and omissions may be made therein and thereto, without departing from the spirit and the scope of the invention.

Having thus described typical embodiments of my invention, that which I claim as new and desire to secure by Letters Patent is:

1. An improved surface acoustic wave variable delay line comprising:
   a piezoelectric and semiconductive substrate;
   a rectifying contact disposed on a surface of said substrate;
   a pair of acoustoelectric transducers disposed on said substrate at opposite ends of said contact for launching and detecting piezoelectric surface acoustic waves in said substrate beneath and contact at frequencies within a design range of frequencies;
   a source of variable voltage connected to said contact for altering the concentration of carriers in said substrate, whereby variations in said voltage alter the potential and velocity of the surface acoustic wave in said substrate; in which the improvement comprises:
   said rectifying contact being segmented, to thereby provide control over carrier concentration between and beneath the segments.

2. A variable delay line according to claim 1 wherein said substrate comprises an insulating piezoelectric layer disposed on a semiconductive material.

3. A variable delay line according to claim 2 wherein said source of variable tuning voltage is capable of providing a voltage to said rectifying contact sufficient to provide carrier concentration at the interface between said semiconductive material and said piezoelectric layer to substantially short circuit said interface.

4. A variable delay line according to claim 1 wherein said substrate comprises a monolithic piezoelectric and semiconductive material having a semiconducting layer extending from said surface into said substrate to a depth on the order of a wavelength of a surface acoustic wave at a frequency within said design range of frequencies in said material, and wherein said source of variable tuning voltage is capable of providing a voltage to said rectifying contact sufficient to deplete the carrier concentration in said semiconducting layer to render said layer semi-insulating.

5. A variable delay line according to claim 4 additionally comprising an amplifier formed integrally in said semiconducting layer, and conductors disposed on said surface for connecting the input of said amplifier to one of said acoustoelectric transducers and for connecting the output of said amplifier to the other of said acoustoelectric transducers, said variable delay line thereby being integrally formed into a monolithic voltage controlled oscillator.

6. A variable delay line according to claim 1 additionally comprising an amplifier formed integrally in said substrate, and conductors disposed on said surface for connecting the input of said amplifier to one of said acoustoelectric transducers and for connecting the output of said amplifier to the other of said acoustoelectric transducers, said variable delay line thereby being integrally formed into a monolithic voltage controlled oscillator.

* * * * *